United States Patent [19]

Miwada

[11] Patent Number: 5,306,932
[45] Date of Patent: Apr. 26, 1994

[54] CHARGE TRANSFER DEVICE PROVIDED WITH IMPROVED OUTPUT STRUCTURE

[75] Inventor: Kazuo Miwada, Tokyo, Japan

[73] Assignee: NEC Corporation, Tokyo, Japan

[21] Appl. No.: 989,889

[22] Filed: Dec. 10, 1992

Related U.S. Application Data

[63] Continuation of Ser. No. 854,791, Mar. 23, 1992, abandoned, which is a continuation of Ser. No. 555,695, Jul. 23, 1990, abandoned.

[30] Foreign Application Priority Data

Jul. 21, 1989 [JP] Japan ................................. 1-190233

[51] Int. Cl.$^5$ .............................................. H01L 29/78
[52] U.S. Cl. .................................. 257/239; 257/236; 257/249; 377/60; 377/62
[58] Field of Search ................ 357/24, 24 LR, 24 M; 257/236, 239, 249; 377/60, 62

[56] References Cited

U.S. PATENT DOCUMENTS 4,939,560 7/1990 Naraba et al. ........................ 357/24

FOREIGN PATENT DOCUMENTS

| | | | |
|---|---|---|---|
| 56-36162 | 4/1981 | Japan | 357/24 |
| 60-132367 | 7/1985 | Japan | 357/24 |
| 60-150671 | 8/1985 | Japan | 357/24 |
| 60-254772 | 12/1985 | Japan | 357/24 |
| 62-245670 | 10/1987 | Japan | 357/24 |
| 1-185970 | 7/1989 | Japan | 357/24 |

Primary Examiner—Ngan Ngo
Attorney, Agent, or Firm—Sughrue, Mion, Zinn, Macpeak & Seas

[57] ABSTRACT

A charge transfer device in which a charge transfer section, an output gate, a floating diffused region, a reset gate electrode, a reset drain region, a barrier gate electrode and an absorption drain region are provided in semiconductor substrate. The reset drain region for resetting or draining charges in the floating diffused region is connected via a capacitor to a constant potential terminal. The absorption drain region is provided with a voltage booster for raising the amplitude of the transfer pulse to a level higher than the power source voltage. The output voltage of the voltage booster is supplied to the absorption drain region. The channel potential beneath the barrier gate electrode is set lower than that beneath the reset gate electrode.

3 Claims, 4 Drawing Sheets

CHARGE TRANSFER DEVICE PROVIDED WITH IMPROVED OUTPUT STRUCTURE

This is a continuation of application Ser. No. 07/854,791, filed Mar. 23, 1992, now abandoned, which is a continuation of application Ser. No. 07/555,695, filed on Jul. 23, 1990, now abandoned.

BACKGROUND OF THE INVENTION

The present invention relates to a solid-state charge transfer device such as a charge coupled device (CCD).

A floating diffused region is widely used as a charge detecting means in a solid-state charge transfer device. In such a charge transfer device, a signal charge transferred through the channel region of a charge transfer section is led to the floating diffused region. After a quantity of charges transferred to the floating diffused region are converted into a voltage form signal to be outputted, the charges are drained to a reset drain through a channel under a reset gate.

The floating diffused region and the reset drain region are impurity-doped regions separately formed in a semiconductor substrate. The reset gate is provided on the semiconductor substrate between the floating diffused region and the reset drain region via an insulating layer. The floating diffused region, the reset gate electrode and the reset drain region constitute a field effect transistor (reset transistor).

The drain of charges from the floating diffused region is achieved by turning this reset transistor on. In order to accomplish this drain of charges, the potential of the reset drain should be higher than a certain level and held at that certain level. At the same time, the channel potential under the reset gate electrode in the aforementioned on-state of the reset transistor should be somewhat lower than that of the reset drain region. Because of these circumstances, the amplitude of the reset pulse to be applied to the reset gate electrode is usually greater than that of the transfer pulse of the charge transfer section. For instance, in an n-type buried channel charge coupled device, the amplitude of the transfer pulse is 5 volts; that of the reset pulse, 8 volts, and the voltage supplied to the reset drain region, 12 volts. Further in this example, when the reset pulse swings between 0 and 8 volts, the channel potential under the reset gate electrode changes between 7 volts and approximately 13.5 volts. As the channel potential (about 13.5 V) of a reset transistor in the on-state is higher than the drain voltage, which is 12 volts, the reset transistor is driven into an on-state in a complete transfer mode to reset the potential of the floating diffused region to that of the reset drain region.

In a system using an image sensor of a charge coupled device, such as a facsimile system, the power voltage for the peripheral circuits using the output from the charge coupled device is as low as 5 volts, for instance, so that a charge coupled device operable at a low power voltage is widely demanded.

The drain voltage of 12 volts can be realized with relative ease with a voltage booster. However, a voltage booster for enhancing the 5 volts of the reset pulse to 8 volts is more complex to provide than the aforementioned voltage booster from 5 volts to 15 volts and accordingly should be avoided in a semiconductor integrated circuit. On the other hand, if a reset pulse of 5 volts in amplitude is applied to the reset gate electrode, the channel potential of the reset transistor in on-state is about 11 volts in the above cited example, lower than the 12 volts in potential at the reset drain region. As a result, the reset transistor is driven into an on-state in an incomplete transfer mode. In such incomplete transfer mode operation, it is impossible to completely drain the signal charges from the floating diffused region, and the dynamic range of the signal output will become correspondingly narrower.

Japanese Patent laid-open Application No. 59-138376 discloses an output circuit for a charge coupled device operable with a low voltage supplied to the reset drain region. Two examples are disclosed therein. In the first example, first and second gates are arranged between the floating diffused region and the reset drain region. The first gate, similar to the charge transfer section, includes a pair of barrier and storage electrodes. The second gate is supplied with the same voltage as the output gate which is formed adjacent to the floating diffused region in the charge transfer section, but the insulating film formed thereunder is thickened to keep the channel potential thereunder lower than the channel potential under the output gate. The charges in the floating diffused region, after being transferred under the storage electrode of the first gate, are drained to the reset drain region. The first gate receives the same pulse as is supplied to the output gate. In this way, the voltage supplied to the reset drain region can be lowered, because the potential at the reset drain region is sufficient if having a value slightly deeper than the channel potential under the storage electrode of the first gate, when the channel potential is lower. The transfer from the floating diffused region to under the storage electrode of the first gate is performed in an incomplete transfer mode, because the channel potential under the first barrier electrode is lower than that under the storage electrode.

In the second example, a third gate and an intermediate drain are arranged between the floating diffused region and the first gate in the first example, and a large-capacity capacitor is connected between the intermediate drain and the grounding terminal. The charges in the floating diffused region, after being first drained into this intermediate drain through the third gate, are finally drained into the reset drain held at a constant voltage. The transfer of charges from the floating diffused region to the reset drain is performed in a complete transfer mode. By supplying a different pulse to the second gate from that applied to the output gate, the potential at the reset drain can be further lowered. A pulse of a greater amplitude is required, however, when the charge under the storage electrode of the first gate is drained into the reset drain.

The potential at the reset drain, in both the first and the second examples, is made lower than the channel potential under the storage electrode.

As the potential at the reset drain bears on the formation of a transfer channel in a buried channel type charge coupled device, it may become necessary not only to lower the voltage to be applied to the reset drain but also to alter the impurity concentration in the channel layer and the peak voltage of the transfer pulse. Therefore, it is not necessarily advantageous to keep the reset drain voltage low.

BRIEF SUMMARY OF THE INVENTION

An object of the present invention is to provide an electric charge transfer device capable of normal operation with a single low-voltage power source.

Another object of the invention is to provide an electric charge transfer device free from deterioration of the dynamic range even if the amplitude of the reset pulse is equal to that of the transfer pulse.

In an electric charge transfer device according to the invention, an output gate is arranged as a final stage of a charge transfer section, and a floating diffused region is provided adjacent to the output gate. There is a reset gate electrode adjacent to the floating diffused region, and adjacent to the reset gate electrode is a reset drain region. A large-capacity capacitor is connected between the reset drain region and a reference potential terminal. Further, a barrier gate adjoins the reset drain region, and an absorption drain region is arranged next to the barrier gate. The barrier gate has a barrier gate electrode, provided on a semiconductor substrate via a gate insulating film, and the channel potential under the barrier gate electrode is, lower than that of the reset gate electrode when in the resetting operation. In a preferred arrangement the gate length of the barrier gate electrode is somewhat elongated when a reset gate electrode has a proper gate length, to be accompanied by a short channel effect.

There further is a voltage booster inserted between the absorption drain region and an external terminal. This voltage booster can be readily realized with a circuit which enlarges the amplitude of the transfer pulse supplied to the charge transfer section.

The presence of the voltage booster makes it possible to sufficiently deepen the potential of the absorption drain region even if the voltage of the power source is low.

The charges in the floating diffused region are periodically drained, first temporarily to the reset drain region connected to the capacitor and then to the absorption drain connected to the voltage booster. As the large-capacity capacitor is connected to the reset drain region, its potential fluctuations can be ignored. The potential at the reset drain region can be deemed to be fixed at the channel potential under the barrier gate electrode. As the potential under the barrier gate electrode is set shallower than that under the reset gate electrode, the reset transistor consisting of the floating diffused region, the reset gate electrode and the reset drain region is driven into an on-state of a complete transfer mode. Signal charges remaining in the floating diffused region can be completely drained with a low-voltage power source.

BRIEF DESCRIPTION OF THE DRAWINGS

The above and other objects, features and advantages of the present invention will become more apparent by referring to the following detailed description of the invention taken in conjunction with the accompanying drawings, in which.

DETAILED DESCRIPTION OF THE PREFERRED EMBODIMENTS

Figure 1:
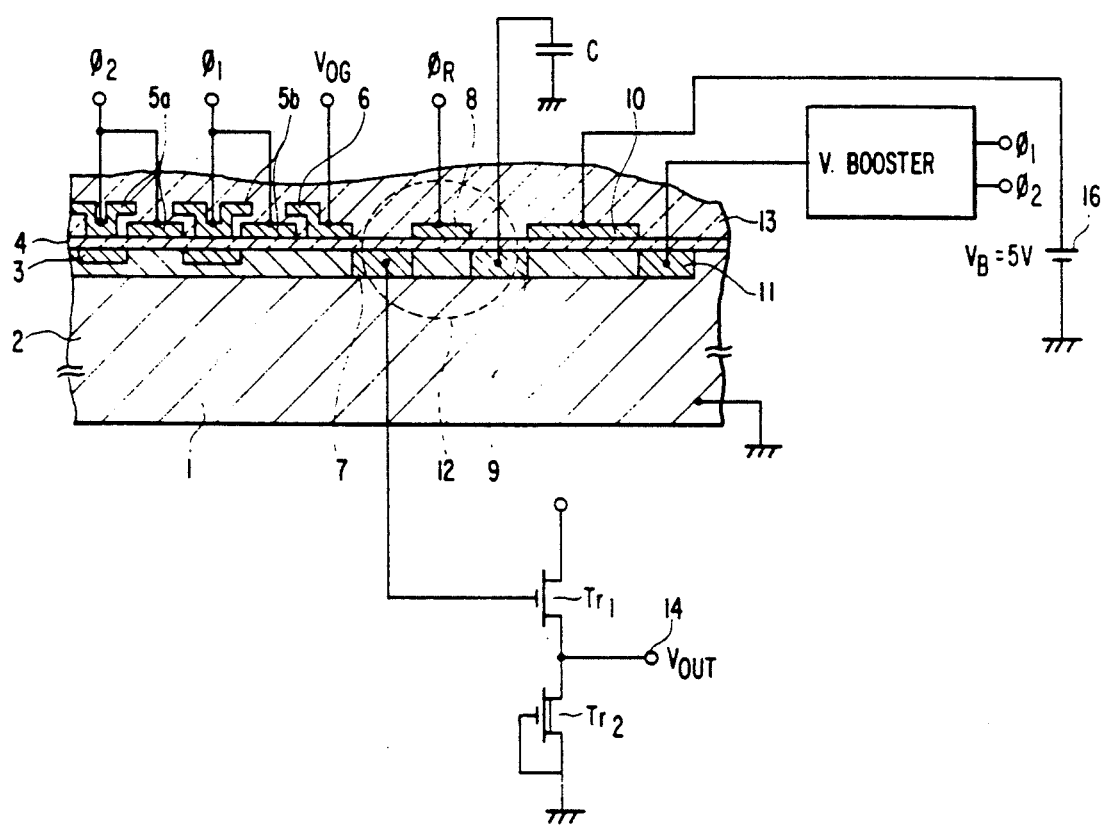
FIG. 1 is a rough sectional view describing the output circuit structure of an n-type buried channel charge coupled device according to a first preferred embodiment of the invention.

Referring to FIG. 1, in a first preferred embodiment of the present invention, an n-type diffused region 2 is formed over the surface of a p-type silicon substrate 1 whose impurity concentration is $5 \times 10^{15}$ cm$^{-3}$. The impurity concentration, thickness and width of the n-type diffused region 2 are $2 \times 10^{16}$ cm$^{-3}$, 1 micrometers and 10 micrometers, respectively. Over the surface of the silicon substrate 1 is provided a 100 nm thick gate oxide film 4, over which are arranged transfer electrodes 5a and 5b, an output gate electrode 6 and a reset gate electrode 8. These electrodes are made of phosphorus-doped polycrystalline silicon films of 400 nm in thickness and 20 $\Omega/\square$ in sheet resistance. Each is 5 microns in width (gate length). In the n-type diffused region 2 (n-type buried channel) under the transfer electrodes are alternately formed p-type barrier regions 3 ($1 \times 10^{15}$ cm$^{-3}$ in impurity concentration and at most 0.1 micrometers in thickness). The transfer electrode provided with one of the p-type barrier layers 3 is the barrier electrode, while that provided with none is the storage electrode. An n+-type floating diffused region 7 ($2 \times 10^{17}$ cm$^{-3}$ in impurity concentration) is provided adjacent to a position immediately beneath the output gate electrode 6. The position immediately beneath the reset gate electrode 8 adjoins the floating diffused region 7 on one side and a reset drain 9 (an n+-type diffused region of $2 \times 10^{17}$ cm$^{-3}$ in impurity concentration) on the other.

To adjacent pairs of transfer electrodes 5a and 5b are respectively supplied transfer clocks $\phi_1$ and $\phi_2$, which are 5 V at the high level and 0 V at the low level and 180° apart in phase. A fixed gate voltage $V_{OG}$ (3 V for example) is applied to the output gate electrode 6 to control the flow of charges from the charge transfer section into the floating diffused region 7. To the reset electrode 8 is supplied a reset clock $\phi_R$, which is the same as the clock $\phi_1$ in phase, but shorter than the clock $\phi_1$ in high level duration, 5 V at the high level and 0 V at the low level, to reset the potential of the floating diffused region 7 to that of the reset drain region 9 at regular intervals by draining charges in the floating diffused region 7 to the reset drain region 9. The floating diffused region 7 is connected to the gate electrode of an enhancement type n channel MOS transistor Tr1 in a source follower circuit, which consists of the transistor Tr1 and a depression type n channel MOS transistor Tr2.

Further in the first embodiment, the reset drain 9 is grounded via a capacitor C, whose capacity is 100 to 1,000 times as great as that of the capacity (for instance 0.01 pF) of the floating diffused region 7, 5 pF for example. A barrier gate electrode 10 (phosphorus-doped polycrystalline silicon film) of 10 micrometers in gate length is provided via the gate oxide film 4 over the n-type diffused region 2 adjoining the reset drain region 9, and connected to an external power source 16. Adjacent to the n-type diffused region 2 beneath the barrier gate electrode 10, there is arranged an absorption drain region 11 (an n+-type diffused region of $2 \times 10^{17}$ cm$^{-3}$ in impurity concentration), to which a potential of 12 V is supplied by a voltage booster 15.

Figure 3:
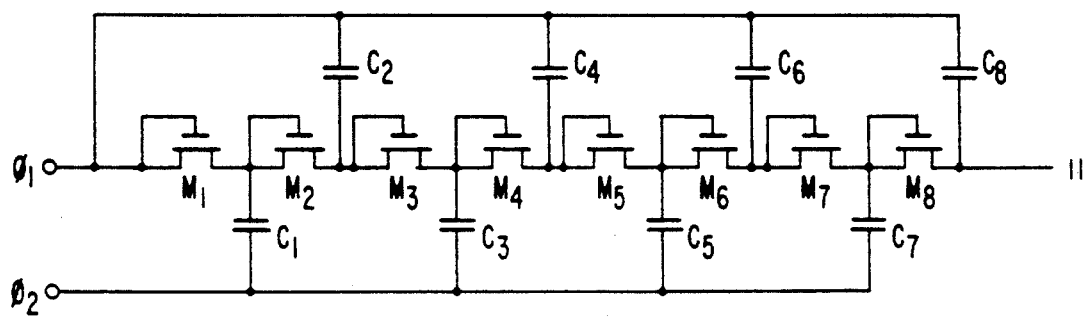
FIG. 3 is a circuit diagram illustrating the voltage booster used in the first embodiment.

Referring now to FIG. 3, MOS transistors $M_1, M_2, \ldots, M_8$ are connected in cascade in the voltage booster 15. These MOS transistors have a common gate oxide film of 100 microns in thickness and source/drain regions of $2 \times 10^{17}$ cm$^{-3}$ in impurity concentration and present a threshold voltage of 0.7 volts. The MOS transistors $M_1$ to $M_8$ are formed on the same semiconductor chip as the n-type buried channel charge coupled device.

The gate of the MOS transistor $M_1$ is supplied with the transfer clock $\phi_1$. The transfer clock $\phi_1$ is also supplied to the output side of the MOS transistors $M_2$, $M_4$, $M_6$ and $M_8$ through capacitors $C_2$, $C_4$, $C_6$ and $C_8$. To the output side of the MOS transistors $M_1$, $M_3$, $M_5$ and $M_7$ is supplied the transfer clock $\phi_2$ through capacitors $C_1$, $C_3$, $C_5$ and $C_7$. The capacities of the capacitors $C_1$, $C_2$, $\ldots C_8$ are 3 pF each. Thus, the voltage booster uses diode-connected MOS transistors instead of diodes in an eightfold voltage doubler circuit. The use of the transfer clocks $\phi_1$ and $\phi_2$, both 5 V in amplitude, gives a D.C. voltage of about 12 V. The number of stages is increased, due to the inability of this circuit, compared to a circuit using diodes, to achieve an efficient boosting on account of the back gate effect of the MOS transistors.

Figure 2:
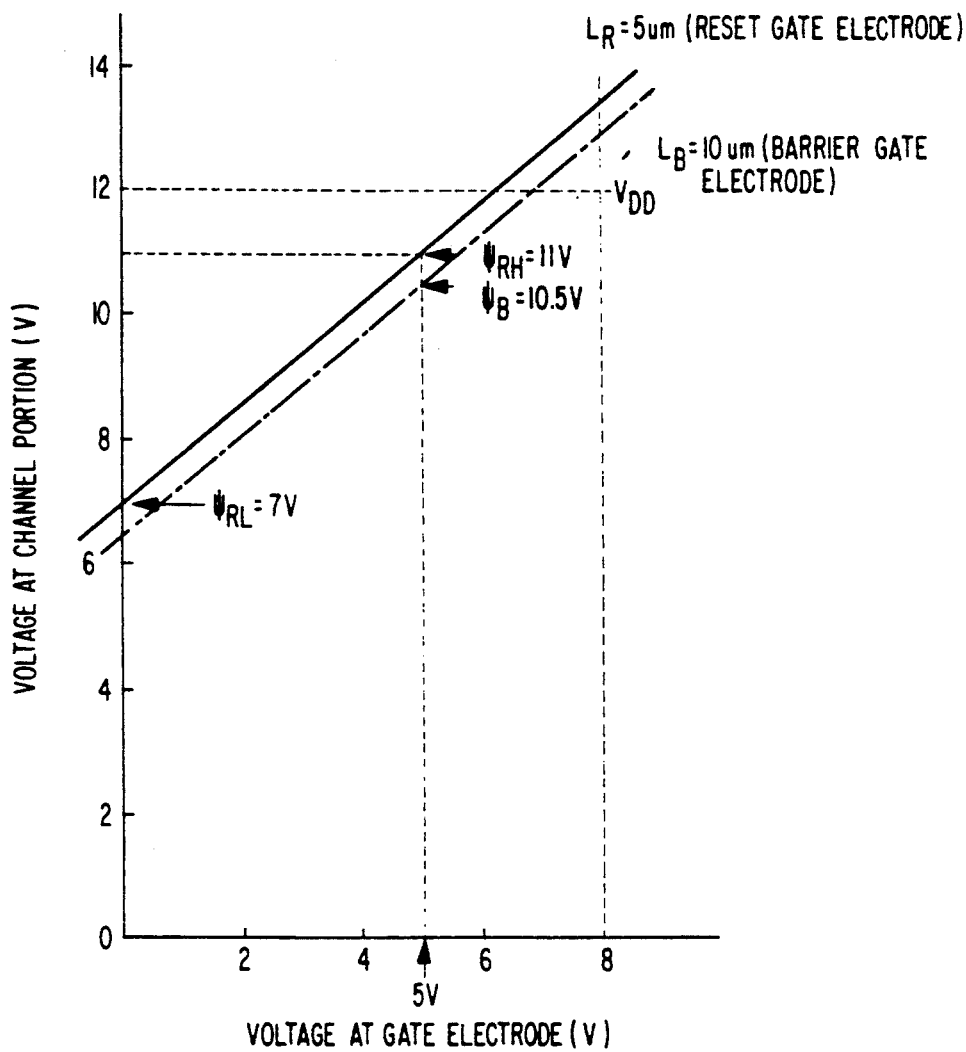
FIG. 2 is a graph illustrating the relationship between the channel potential and the gate voltage in the first preferred embodiment of the invention.

In the output circuit of FIG. 1, the gate lengths $L_R$ and $L_B$ of the reset gate electrode and the barrier gate electrode are 5 micrometers and 10 micrometers, respectively. Referring to FIG. 2, when 5 volts is applied to the reset gate electrode 8, the channel potential $\Psi_{RH}$ beneath that gate electrode will become 11 V, and the channel potential $\Psi_B$ beneath the barrier gate electrode held at a constant voltage of 5 volts will be fixed at 10.5 V. The difference in channel potential underneath, in spite of the same voltage supplied to the gate electrodes, is due to the short channel effect (which poses a problem from a gate length of around 7 microns on).

Figure 4:
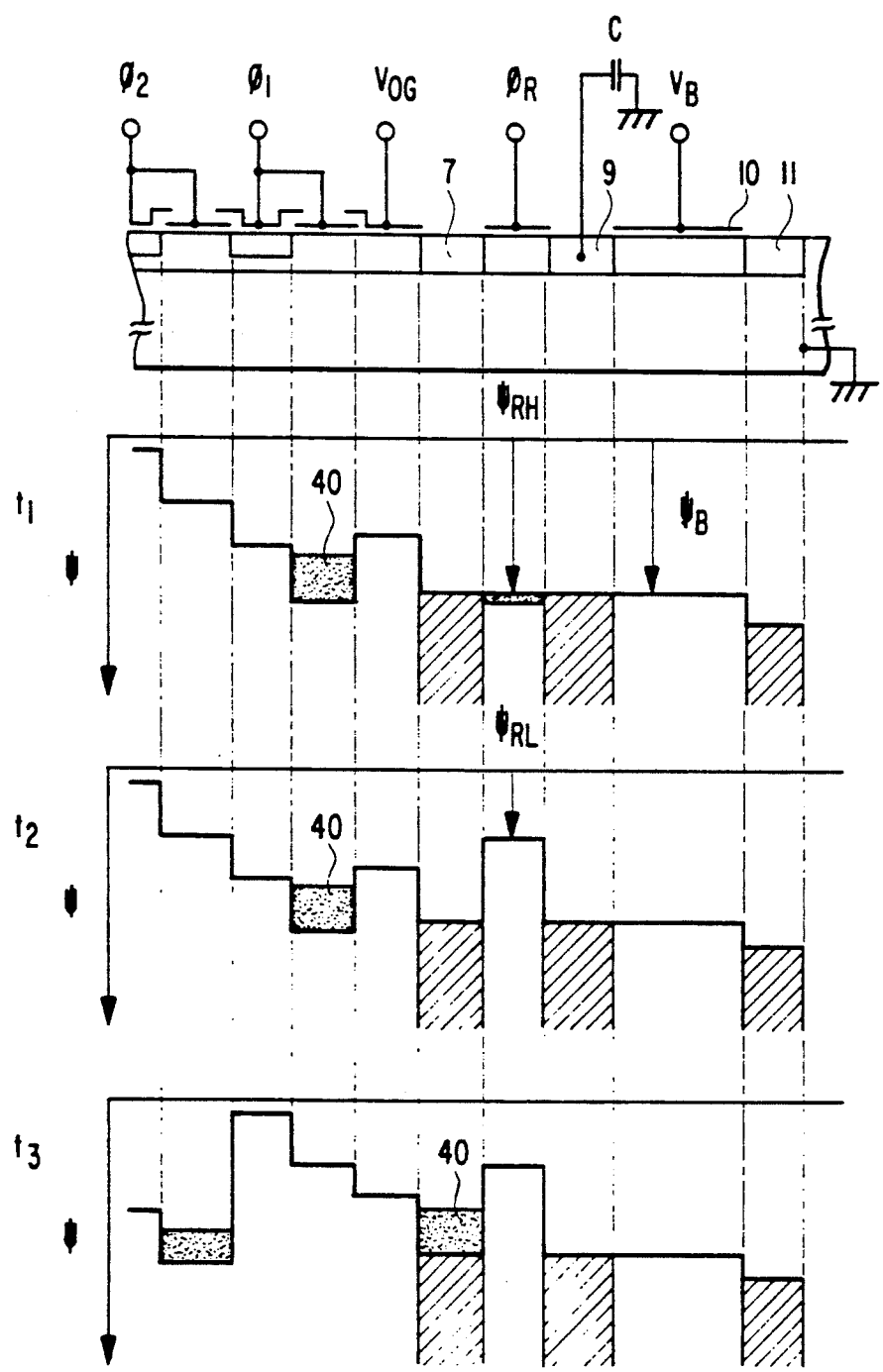
FIG. 4 is a rough sectional view and a potential diagram for use in describing the operation of the first embodiment.

Incidentally, as a higher voltage (12 V) is applied to the absorption drain region 11, the potential at the reset drain region 9 is equal to the channel potential ($\Psi_B = 10.5$ V) beneath the barrier gate electrode, as shown in FIG. 4.

Now, if the reset clock $\phi_R$ reaches its high level (5 V) at a time $t_1$, the channel potential $\Psi_{RH}$ beneath the reset gate electrode 8 will be 11 volts according to FIG. 2, and this level is higher than the potential $V_{RD}$ ($=\Psi_B=10.5$ V) of the reset drain 9. Therefore, at this time of resetting, the reset transistor 12 is driven into an on-state in complete transfer mode, fully drains signal charges in the floating diffused region 7, and resets the potential at this diffused region 7 to the same level as the potential $V_{RD}$ ($=10.5$ V) of the reset drain region 9.

The on-state of the reset transistor 12 leads to the inflow of charges from the floating diffused region 7 to the reset drain region 9 and consequently a variation in the potential $V_{RD}$ there, but the variation in the potential $V_{RD}$ due to the inflow of charges can be ignored if the capacity of the capacitor C is sufficiently large.

Afterwards, at a time $t_2$, the reset clock $\Psi_R$ drops to its low level, and at a time $t_3$, a signal charge 40 flows into the floating diffused region 7.

Here, the voltage variation due to the inflow charge 40 into the floating diffused region 7 is guaranteed in a range of $\Psi_B$ to $\Psi_{RL}$, as is apparent from FIG. 4, $\Psi_{RL}$ being the channel potential beneath the reset gate electrode 8 when the reset clock $\Psi_R$ is at its low level. Now, if the low level of the reset clock $\Psi_R$ is 0 V, $\Psi_B - \Psi_{RL}$ will be 3.5 volts, because $\Psi_{RL}$ is 7 volts according to FIG. 2. Since a 2 volt variation is usually considered sufficient, a sufficiently wide dynamic range can be assured if the input voltage is 5 V.

Figure 5:
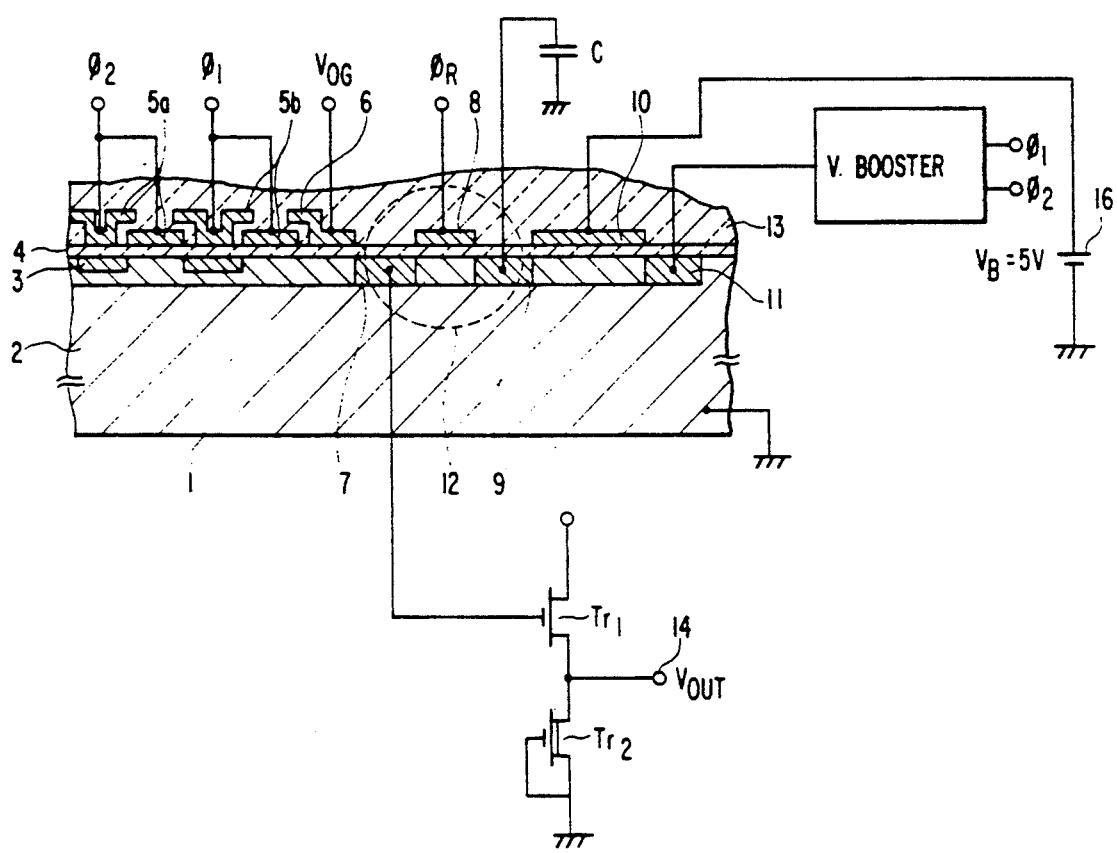
FIG. 5 is a rough sectional view describing the output circuit structure of an n-type buried channel charge coupled device according to a second preferred embodiment of the invention.

FIG. 5 shows a sectional view of a second preferred embodiment of the present invention. This embodiment differs from the first one in that the gate length of the barrier gate electrode 10a is 5 micrometers, equal to that of the reset gate electrode 8, and the that a p-type barrier region 17 is formed beneath this barrier gate electrode 10a. The p-type barrier region 17 is 0.3 micrometers in depth, and its impurity concentration need not be higher than, or may be even half as high as, that of the p-type barrier region 3. At any rate, it is arranged so that the channel potential $\Psi_B$ beneath the barrier gate electrode 10a is lower than the channel potential $\Psi_{RH}$ beneath the reset gate electrode 8, which is the potential at the time when the reset clock $\phi_R$ is at its high level, so that charges in the floating diffused region 7 can be completely drained.

As hitherto described, the present invention makes it possible, by (1) providing an absorption drain region via a barrier gate in a stage following the reset drain region connected to a capacitor, (2) making the channel potential of the barrier gate lower than that under the reset gate electrode when in the resetting operation, and (3) providing a voltage booster whose output voltage is supplied to the absorption drain region, to obtain a charge transfer device free from deterioration in the dynamic range resulting from faulty resetting of the floating diffused region even if the power voltage or the driving pulse supplied from outside is low in voltage. Since the charge transfer section may be a prior art structure and requires no alteration, the voltage requirement can be lowered without entailing major redesign.

Although the invention has been described with reference to specific embodiments, this description is not meant to be construed in a limiting sense. Various modifications of the disclosed embodiments, as well as other embodiments of the invention, will become apparent to persons skilled in the art upon reading the description of the invention. It is therefore contemplated that the appended claims will cover any modifications or embodiments which fall within the true scope of the invention.

What is claimed is:

1. A solid-state charge transfer device comprising:
an electric charge transfer section provided in a semiconductor substrate, said electrical charge transfer section being supplied with transfer clock pulses for electrical charge transfer therethrough;
a floating diffused region formed following said electric charge transfer section in said semiconductor substrate;
a reset drain region formed in the vicinity of and apart from said floating diffused region in said semiconductor substrate;
an absorption drain region formed in the vicinity of and apart from said reset drain region in said semiconductor substrate;
an output gate electrode, provided over said semiconductor substrate between said electric charge transfer section and said floating diffused region, for controlling the inflow of electric charges from said electric charge transfer section to said floating diffused region;
a reset gate electrode, provided over said semiconductor substrate between said floating diffused region and said reset drain region, for resetting the potential of said floating diffused region to that of said reset drain region, said reset gate electrode being supplied with a reset clock pulse for periodically resetting said floating diffused region, said reset clock pulse having a voltage height of a first voltage;

a barrier gate electrode provided over said semiconductor substrate between said reset drain region and said absorption drain region, said barrier gate electrode being supplied with a bias voltage having said first voltage;

a capacitor inserted between said reset drain region and a reference potential terminal;

a voltage booster responding to said transfer clock pulses to generate a boosted voltage having a voltage height higher than said first voltage and to supply said boosted voltage to said absorption drain region; and wherein a channel region under said barrier gate electrode is arranged so that the channel potential beneath said barrier gate electrode becomes lower than the channel potential under said reset gate electrode when in the resetting operation.

2. A solid-state charge transfer device as claimed in claim 1, wherein a length of said barrier gate electrode is larger than a length of said reset gate electrode.

3. A solid-state charge transfer device as claimed in claim 1, further comprising a region formed at a surface of said semiconductor substrate between said absorption drain region and said reset drain region, and having a conductivity type differing from a conductivity type of said absorption drain region and said reset drain region.

* * * * *